United States Patent [19]

Thurston

[11] Patent Number: 5,392,039
[45] Date of Patent: Feb. 21, 1995

[54] SIGMA-DELTA ANALOG TO DIGITAL CONVERTER

[75] Inventor: Andrew M. Thurston, Chelmsford, United Kingdom

[73] Assignee: GEC-Marconi Lmited, Middlesex, United Kingdom

[21] Appl. No.: 886,588

[22] Filed: May 21, 1992

[30] Foreign Application Priority Data

Jun. 1, 1991 [GB] United Kingdom ............... 9111821

[51] Int. Cl.$^6$ .............................................. H03M 1/12
[52] U.S. Cl. ...................................... 341/143; 341/155
[58] Field of Search ................. 341/155, 143; 375/26, 375/27; 333/172, 175, 167

[56] References Cited

U.S. PATENT DOCUMENTS

| | | | |
|---|---|---|---|
| 4,571,560 | 2/1986 | Dobrovolny | 333/175 X |
| 4,857,928 | 8/1989 | Gailus et al. | 341/143 |
| 5,027,120 | 6/1991 | Thurston | 341/143 |

FOREIGN PATENT DOCUMENTS 2232023  11/1990  United Kingdom .

Primary Examiner—Brian K. Young
Attorney, Agent, or Firm—Spencer, Frank & Schneider

[57] ABSTRACT

An analog-to-digital converter has an input for receiving analog signals, a quantizer for producing a digital output of the converter, a first combining node for combining the analog input with a first feedback signal derived from the digital output and producing a first combined signal, and filter circuitry for filtering the first combined signal. The filter circuitry includes at least one filter circuit stage which is not connected to a phase-modifying resistance, and a second combining node for combining an output from the at least one filter circuit stage with a second feedback signal derived from the digital output, and produces a signal for input to the quantizer.

14 Claims, 5 Drawing Sheets

SIGMA-DELTA ANALOG TO DIGITAL CONVERTER

BACKGROUND OF THE INVENTION

1. Field of the Invention

This invention relates to analogue-to-digital (A-D) converters, and especially to sigma-delta analogue-to-digital converters.

2. Background of the Invention

Sigma-delta A-D converters include quantising means for producing a digital output, oversampled relative to the signal bandwidth, and a feedback loop for feeding back a signal derived from the digital output to be combined with the analogue input for input to filter means, the output of the filter means being connected to the quantising means: this is in order to shape the quantisation noise to reduce it in a desired bandwidth (GB-A-2,232,023).

A typical implementation of such a sigma-delta converter is shown in FIG. 1, this having a second order filter and bandpass characteristic. Each part of the loop filter consists of parallel resonant circuits of an inductor and capacitor in parallel, $L_1 C_1$, $L_2 C_2$, in series with resistors $R_1$, $R_2$. Buffers 1–3 provide isolation between the filter stages and between the filter and the quantising means 4 and between the summing node 5 and the analogue input. The feedback loop includes a digital-to-analogue converter (D-A) 6.

The amplitude and phase of the voltage across each stage of the filter is shown in full line in FIGS. 2a, 2b. The effect of the series resistors $R_1$, $R_2$ is to add a uniform step FIG. 2a (shown dashed) to the amplitude response FIG. 2a (also shown dashed) of the resonant circuit and, more importantly, to reduce the phase shift of ±90° produced at low and high frequencies (FIG. 2b, the dashed curve showing the phase shift if the resistors $R_1$, $R_2$ were replaced by short circuits). The reduction in phase shift reduces the tendency to instability which could arise if the combined phase shift of the two filter stages approached 180°, thus turning negative feedback into positive feedback.

A problem with such filter stages is that the buffers 2–3 and summing node 5 inherently have input and output capacitances to earth (FIG. 1, shown dashed) which load the tuned circuit. This degrades the Q of the resonant circuits, since some energy is exchanged between the input and output capacitance and the inductance $L_1$ via the resistors $R_1$, $R_2$, so that energy is dissipated in the resistors. The reduction in the Q factor reduces the peak of the amplitude response and thus degrades the notch in the quantisation noise produced by the sigma-delta modulator and hence the signal-to-noise ratio which can be achieved.

An analagous problem arises in the case of sigma-delta converters with series resonant circuits connected in parallel with resistive means (not shown) to modify the phase response of the resonant circuits.

Another problem which is encountered by both band-pass and base-band sigma-delta A-D converters is that the presence of resistive means in the first stage of the filter imposes a certain bandwidth requirement on subsequent filter stages.

SUMMARY OF THE INVENTION

According to one aspect, the invention provides an analogue-to-digital converter comprising an input for analogue signals, quantising means for producing a digital output, a feedback loop for feeding back a signal derived from the digital output to be combined with the analogue input for input to filter means, the filter means including a stage which comprises a filter circuit which is not connected to phase-modifying resistive means, and which is connected between ground and one input of a pair of differential inputs, and resistive means connected between ground and the other input of the pair of differential inputs.

In the case of bandpass filter means, the input capacitance of the means, e.g., buffer, having the differential inputs which follows the resonant (filter) circuit and the output capacitance of the preceding component, e.g., buffer, in the feedforward path, now combine with the capacitance in the resonant circuit in such a way that the energy no longer passes via any phase-modifying resistor, thereby improving the Q of the resonant circuit and the notch shape of the filter. Nevertheless, the effect at the output of the filter stage referred to is the same as if the filter stage did include phase-modifying resistive means, so that the necessary reduction in phase shift from ±90° is maintained. The means having the differential inputs may be a buffer, but could if desired be the quantising means itself, or any other component.

According to another aspect, the invention provides an analogue-to-digital converter comprising an input for analogue signals, quantising means for producing a digital output, a feedback loop for feeding back a signal derived from the digital output to be combined with the analogue input for input to filter means, a stage of the filter means comprising a filter circuit which is not connected to phase-modifying resistive means, and a signal derived from that stage of the filter means being combined in use with a signal derived from the digital output, for input to the quantising means, of the output of the filter means or the output combined as aforesaid.

The absence of phase-modifying resistive means connected to the filter circuit provides the same improvement of the Q and notch shape in the case of a bandpass filter means as before, and the signal derived from the digital output that is combined with the signal derived from the filter stage, has the same effect as the phase-modifying resistive means provided in the said one aspect of the invention, so that the necessary reduction in phase shift from ±90° can be maintained. The combination of the signal derived from the stage of the filter means comprising the filter circuit, with the signal derived from the digital output, may be directly after that stage, but in the case where the stage is the first stage, the combination could instead be after the signal has passed through a second or third, etc., stage. If the combination is after the only, or after a final, stage of the filter means, the quantising means will be fed the combined output referred to. If the combination is after a first stage of the filter means, and there is no combination after the final stage of the filter means, the quantising means will receive the output of the filter means uncombined with any other signal.

In the case of either aspect of the invention, the absence of the phase-modifying resistive means in a first stage of the filter means (in either baseband or bandpass filter means) permits a reduction in bandwidth in subsequent filter stages, permitting lower power consumption by those stages.

In the case of either aspect of the invention, the filter means could comprise a single stage, two stages, three stages, or a higher number of stages.

The resonant (filter) circuit in the case of bandpass filter means may comprise an inductor and a capacitor, and may be parallel or series, and the filter circuit, in the case of baseband filter means, may be an integrating circuit, e.g., capacitive.

The quantising means may include a comparator and, to avoid this being affected by drift, this may be a.c. coupled to the preceding stage, or any drift may be compensated for by means of d.c. feedback to a stage of the filter means. The d.c. feedback may include an integrator for integrating the data output, converted to analogue form.

The quantising means may be single bit, but could be multi-bit if desired.

The sampling rate of the quantising means may be four times the resonant frequency of the resonant circuit but, since notches in the quantising noise occur at one quarter, three quarters, five quarters, etc., times the sampling rate, the sampling rate could instead be four thirds times the resonant frequency, four fifths times, or four sevenths times, etc.

BRIEF DESCRIPTION OF THE DRAWINGS

Sigma-delta analogue-to-digital converters constructed in accordance with the invention will now be described by way of example with reference to the accompanying drawings, in which.

DETAILED DESCRIPTION OF THE PREFERRED EMBODIMENT

Figure 3:
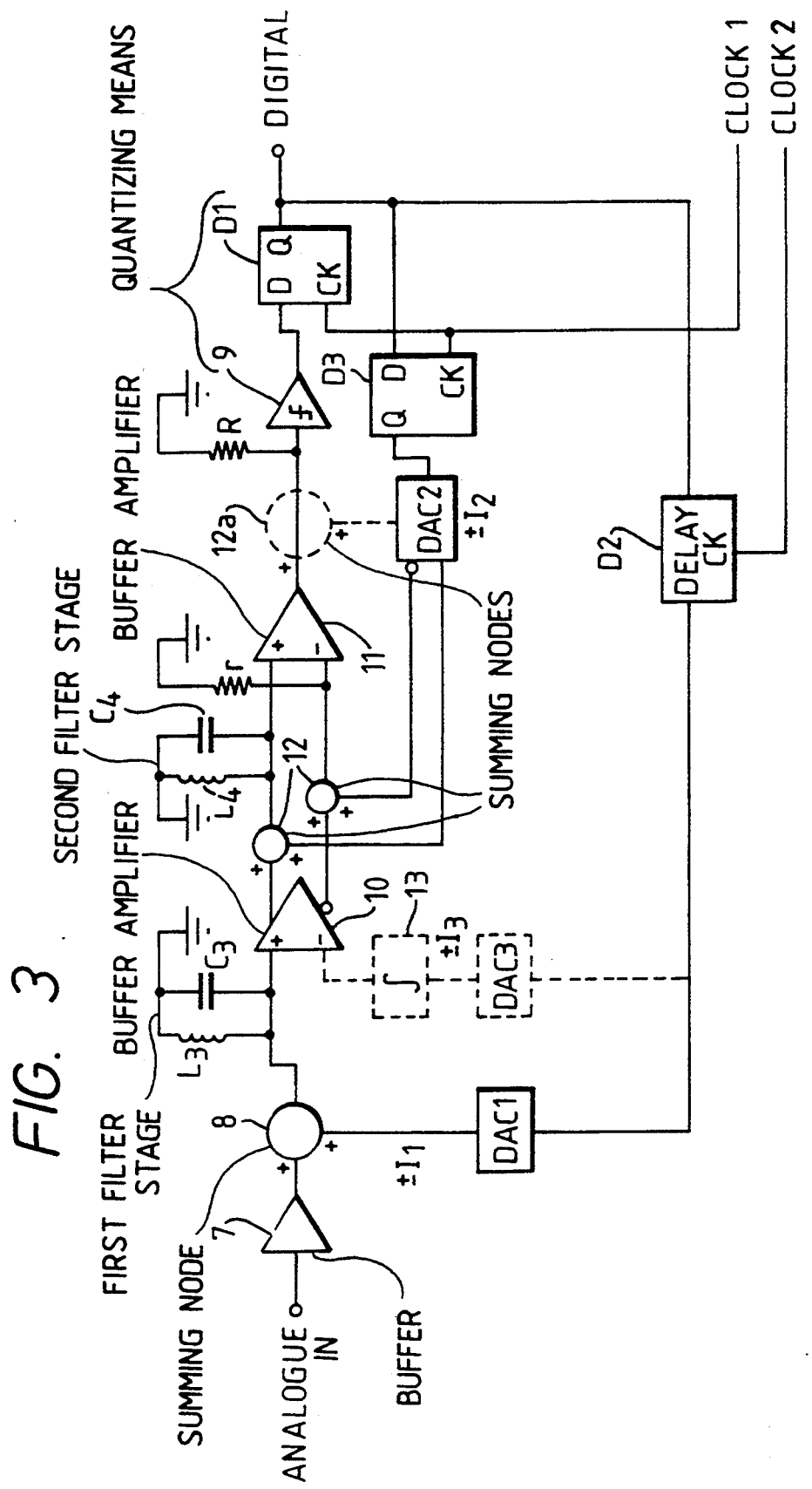
FIG. 3 is a block diagram of a first sigma-delta A-D converter according to the invention.

Referring to FIG. 3, the first sigma-delta converter has a bandpass characteristic and employs a second order parallel loop filter. This is tuned to one quarter the sampling frequency of the quantising means of the sigma delta converter, and so is suitable for conversion of signals at this frequency, at which the sigma-delta converter produces its null in the quantisation noise. If desired, the filter could be tuned to three quarters, five quarters, seven quarters, etc., of the sampling frequency. The sigma-delta converter shown in FIG. 3 feeds to decimation filters (not shown) for removing out of band noise and for reducing the sampling rate.

The analogue voltage input is applied to a buffer 7 having a high input impedance and provides an output current which is applied to a summing node 8. Digital output data appears at the output of quantising means formed by comparator 9 and clocked D-type flip-flop D1, which provides one bit data voltage samples, (which could be current samples if desired) from the Q output, the output of comparator 9 being transferred to the D input of the D-type flip-flop D1 and from the D input to the Q output on each clock pulse. The data is stored for one sample period at the Q output of flip-flop D1 before being latched by both flip-flops D2 and D3.

A feedback loop which includes digital delay D2 (e.g. D-type flip-flop providing a one clock pulse delay) feeds the data pulses to digital-to-analogue converter DAC1 which provides current pulses (of $\pm I_1$) which is summed with the analogue input current at summing node 8. The delay is clocked at the same rate, but not necessarily at the same phase, as flip-flops D2 and D3. A delay of two clock periods between data being sampled and that data being reproduced by DAC1 is equal to 180° of phase shift of the analogue signal at the resonant frequency of the resonant circuit, and since at the resonant frequency, the loop filter has no phase shift, the summation at the summing node 8 is equivalent to negative feedback which is, of course, necessary for stability.

Buffer amplifier 10 of high input and high output impedance monitors the voltage across the first stage of the filter comprising inductor $L_3$ and capacitor $C_3$ in parallel, which is connected without any phase-modifying series resistance between the input (+) to the buffer 10 and ground. The buffer 10 provides a differential output current (i.e. two current outputs equal in magnitude and opposite in sign) to summing nodes 12 connected to its inverting and non-inverting outputs. The summing nodes 12 also receive an analogue version of the digital output ($\pm I_2$) via a digital-to-analogue converter DAC2. This current is delayed by one clock period due to D-type flip-flop D3 (the D-type flip-flop D1 having stored the data for a one period delay). Thus, the signal generated by DAC2 and applied to the summing nodes 12 will affect the signal sampled at the D-type flip-flop D1 at the sampling instant which is two sampling instants later than that when the data was first sampled.

Buffer amplifier 11 of high input impedance and high output impedance monitors the voltage across the second stage of the filter comprising inductor $L_4$ and capacitor $C_4$ in parallel without any phase-modifying series resistance, and across resistor r. The parallel inductor $L_4$ and capacitor $C_4$ are connected between the non-inverting input (+) and ground, and the resistor r is connected between the inverting input (−) and ground. The output current from the buffer amplifier 11 is converted to a voltage at the comparator 9 input by means of resistor R.

Figure 1:
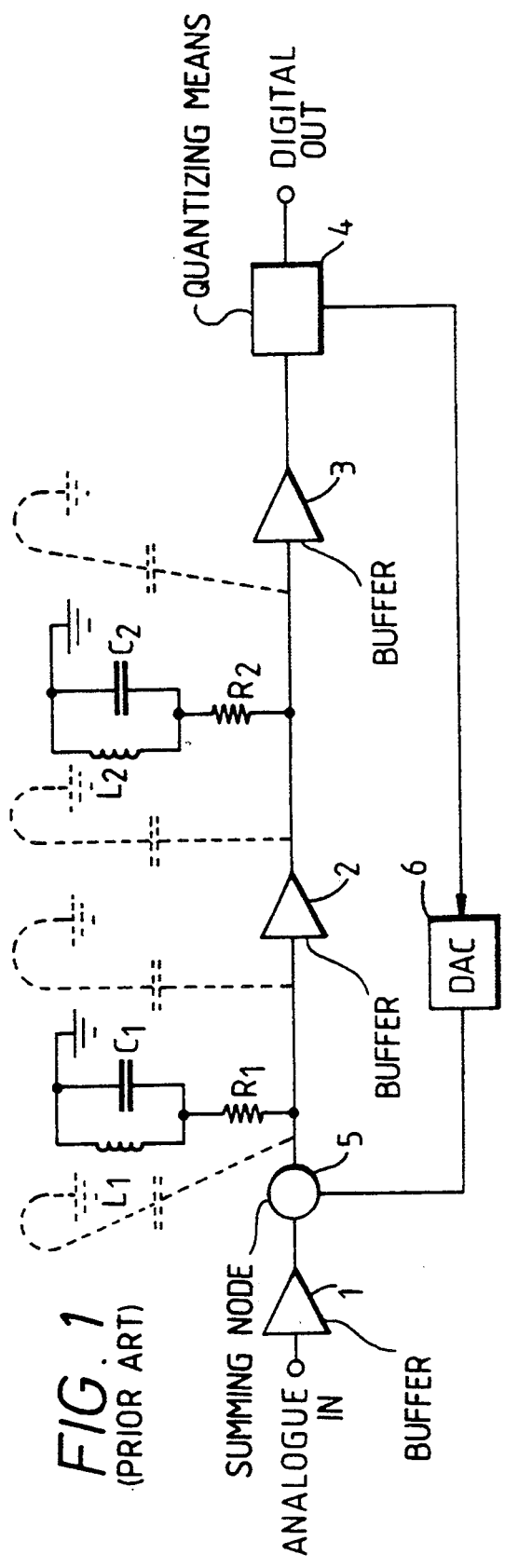
FIG. 1 is a conventional converter.
Figure 2B:
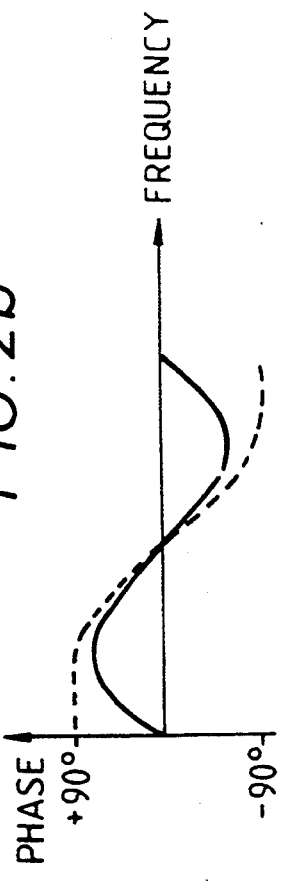
FIGS. 2a and 2b are graphs representing amplitude and phase, respectively, of the FIG. 1 converter.
Figure 2A:
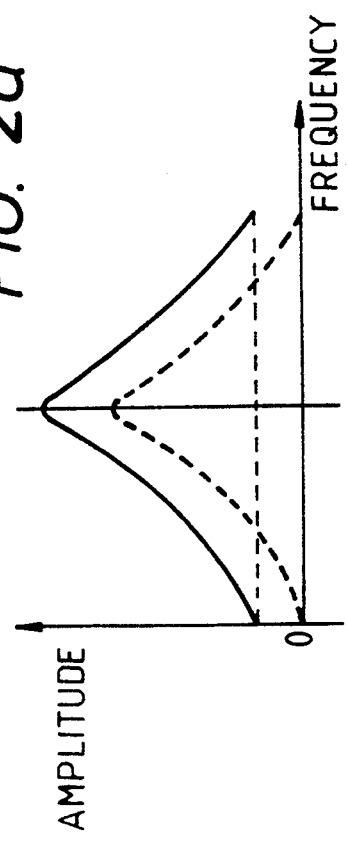

According to one aspect of the invention, the second stage of the filter ($C_4$, $L_4$) has the same effect regarding reduction of phase shift from $\pm 90°$ as in the prior art arrangement shown in FIG. 1, i.e., it has the amplitude and phase characteristics shown in full line in FIGS. 2a, 2b while avoiding the detrimental effects of input capacitance to ground on the Q of that stage of the filter. Thus, the current output of say buffer amplifier 3 in the prior art arrangement shown in FIG. 1 is the product of the voltage across $L_2$, $C_2$, $R_2$ and the transconductance of the buffer amplifier 3. The voltage across $L_2$, $C_2$, $R_2$ is the product of the current through $L_2$, $C_2$, and its impedance, together with the product of the current through $R_2$ (the same current) and its impedance. It is apparent that the buffer amplifier 11 in FIG. 3 will produce the same output current for the same values L C R, transconductance and input signals values. This is because the voltages across $L_4$, $C_4$ will be the same as the voltage across $L_2$, $C_2$, and the voltage across r will be the same as the voltage across $R_2$ (the two current outputs of buffer amplifier 10 being of equal magnitude), and the effect of the inverted signal at the inverting input will be such that the two voltages are summed. The resistance r produces the flat dashed response shown in FIG. 2 and the parallel resonant circuit $L_4$, $C_4$ produces the dashed resonant response, the two curves being summed as before to produce the effect shown in full line. As far as the phase response is concerned, the series resistor r will predominate over the effect of the inductance at low frequencies and the capacitance at high frequencies, and the full line curve will again be produced.

The output capacitance to ground of the buffer amplifier 10 and the input capacitance to ground of the buffer amplifier 11 will sum with the capacitance $C_4$ allowing these quantities to be taken into account when choosing $C_4$, but the resonant current through $C_4$ will not pass through r and degrade the Q of the filter. It should be mentioned that any inter-terminal capacitance of the buffer amplifier will degrade Q, since this will still load the resonant circuit through r, but inter-terminal capacitance is not such a serious problem as capacitance to ground.

The arrangement described for the second stage of the filter may equally be applied to the first stage, and to any or all of any other stages, or to the case of a filter having a single stage only. If desired, the buffer amplifier 11 may be dispensed with, provided that high impedance differential inputs are provided at the comparator 9 of the quantising means.

According to another aspect of the invention, the effect of the series resistor r is produced by a signal derived from the digital output, in this case, the current from the digital-to-analogue converter DAC2. This current is added to the output of the buffer amplifier 10 at summing nodes 12.

The current from DAC2 is designed to produce the effect of a resistor connected between ground and the inverting input of buffer amplifier 10. The amplitude and phase response of $L_3$, $C_3$ is as shown in broken (dashed) line FIG. 2a, 2b. In the same way that resistor r in the second stage produced a particular current in the output of buffer amplifier 11, DAC2 provides an identical current in the output of buffer amplifier 10, in non-inverted and inverted form because the buffer amplifier has differential outputs. The effect on the amplitude response of the first stage of the filter is to add the dashed flat response to produce the full line amplitude and phase response shown in FIGS. 2a, 2b.

Thus, the advantages of a resistor similar to the resistor r in the second stage can be achieved in the first stage of the filter by providing differential digital-to-analogue converters which receive an input from the data output. Equally, the advantages of the resistor r itself in the second stage could be achieved by a digital-to-analogue converter connected to a summing node at the output of the second stage, and the same would apply to any further stages or to just a single stage. Indeed, the third sigma-delta A-D converter described (FIG. 5) is of this type.

The possibility also exists, and this is illustrated by dashed line connection to summing mode 12a which would be provided in place of summing nodes 12 in FIG. 3, of simulating a series resistor for the first filter stage by a digital-to-analogue converter connected to the output of the second filter stage. However, in this case, the loss of the resistor from the first stage also requires an increase in resistance r in the second stage to provide full equivalence. This can be appreciated by reference to FIGS. 4a and 4b, which shows a simplified version of the filter of FIG. 3, with each stage consisting of a parallel inductor and capacitor $L_3C_3$, $L_4C_4$ connected between ground and one input of the differential amplifiers 10, 11, and a resistor $r_1$, $r_2$ connected between ground and the other input of the differential amplifier.

At the first stage, input current pulse I produces a voltage pulse $V_{r_1}$ across resistor $r_1$ and a voltage $V_{L_3C_3}$ across $L_3C_3$ which rises sharply during the current pulse and continues sinusoidally thereafter.

Each voltage $V_{r_1}$, $V_{L_3C_3}$ produces a voltage across each of $r_2$ and $L_4C_4$. Thus, the voltage across $r_2$ consists of a voltage pulse due to $V_{r_1}$ and a voltage due to $V_{L_3C_3}$. The voltage across $L_4C_4$ consists of a voltage due to $V_{r_1}$, sharply increasing during the pulse $V_{r_1}$ and thereafter continuing sinusoidally, together with an increasing sinusoidal voltage due to $V_{L_3C_3}$.

Thus, if resistor $r_1$ is omitted, and pulses from DAC2 are summed with the output from differential amplifier 11, the voltage across $L_4C_4$ due to resistor $r_1$ must be compensated for, and this is done by increasing $r_2$ (the resistor r in FIG. 3) since the voltage signal across $r_2$ due to $L_3C_3$ is of the same form as $r_1$ would have produced across $L_4C_4$. The pulse part of $V_{r_2}$ is of course provided by DAC2.

The comparator 9 operates by assessing whether its input voltage lies above or below a certain threshold. It will be apparent that incorrect results will be obtained if drift occurs in any of the preceding components i.e., buffer amplifiers 10, 11 or adders (summing nodes) 8, 12. An offset could be applied to the comparator 9 and an output from the buffer amplifier 11 smaller than this offset could be masked by the offset and produce an incorrect output from the comparator 9. To overcome this, the comparator 9 may be a.c. coupled, i.e., connected to buffer 11 via a capacitor. Another alternative is indicated by digital-to-analogue converter DAC and integrator 13. The digital output, reconverted to analogue form, is integrated in integrator 13, and is applied to inverting input of buffer amplifier 10 to tend to compensate for any offset applied to comparator 9, so that the time averaged output of the digital output has zero d.c. level.

While the quantising means is single bit, multi-bit quantisation may be employed if desired.

Figure 5:
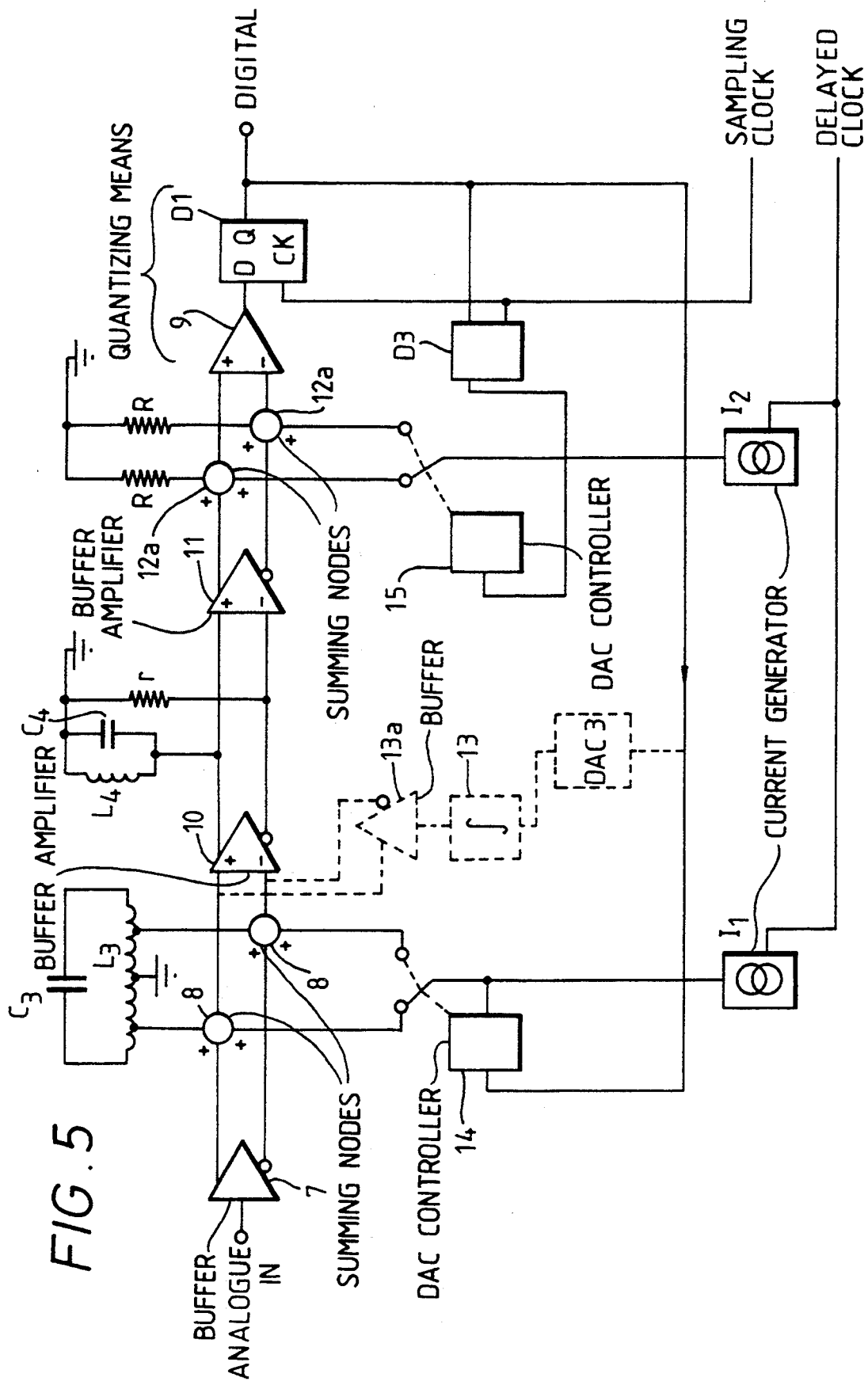
FIG. 5 is a block diagram of a second sigma-delta converter according to another embodiment of the invention, which is a balanced version of the modified form of the first sigma-delta converter.

FIG. 5 shows the circuit of FIG. 3, in the modified form in which DAC2 feeds summing node 12a in place of summing nodes 12, in balanced form. Like parts have been given like reference numerals. Feedback pulses corresponding to those provided by DAC1 and DAC2 are now provided by current generators $I_1$, $I_2$ which are applied to either the inverting or non-inverting lines via DAC controllers 14, 15, the line selected being chosen by the data. Capacitance $L_3$ is earthed at the center and tapped at two points between the center and its ends. DAC3 and integrator 13 may be provided, a buffer 13a providing inverting and non-inverting outputs.

Figure 4A:
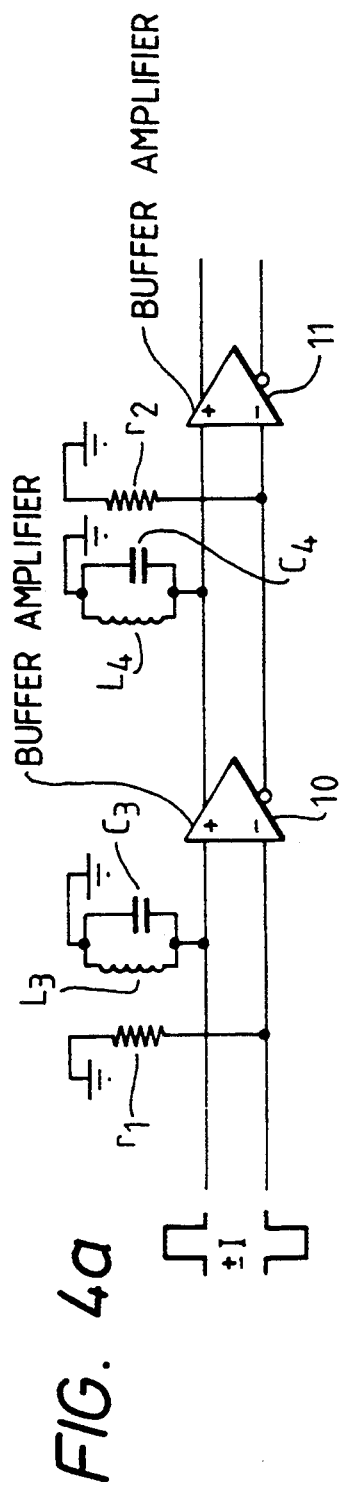
FIGS. 4a and 4b show a modified form of the filter of the converter of FIG. 3 in simplified form, and voltages across various components in response to a pulse input respectively.
Figure 4B:
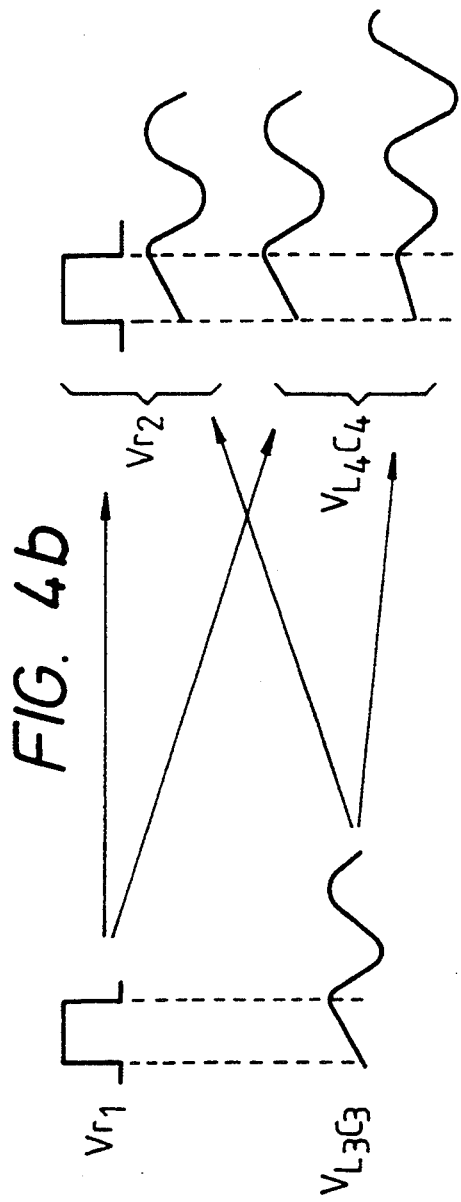
Figure 6:
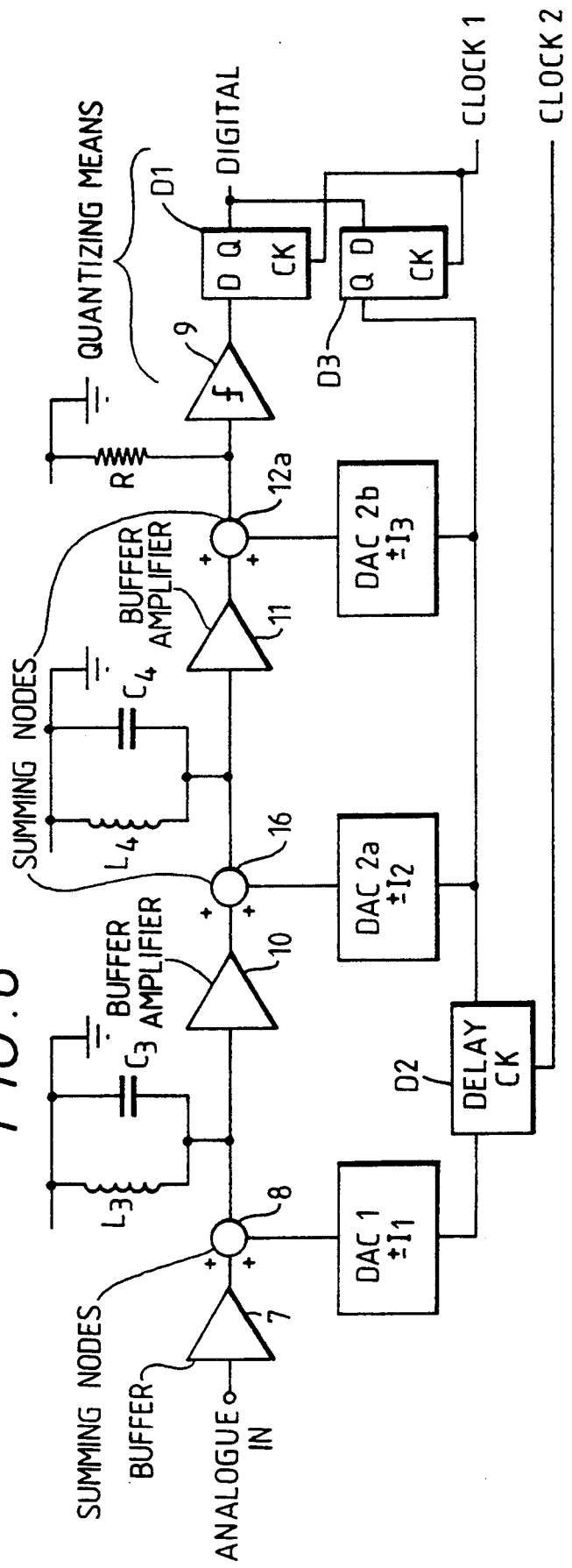
FIG. 6 is a block diagram of a third sigma-delta A-D converter according to another embodiment of the invention.

As mentioned above, the FIG. 3 converter may be modified by substituting resistor r with digital-to-analogue converters at the output of both stages of the filter, and such an arrangement is illustrated in FIG. 6. Again, like reference numerals have been used for like parts. The arrangement is unbalanced, and an additional adder 16 is provided. DAC1 provides the normal feedback pulses for the sigma-delta converter via a delay clocked at the same frequency but not necessarily at the same phase as flip-flops D1, D3. DAC2 *a* provides pulses which simulate the effect of resistor r in FIG. 3 but for the first stage of the filter. DAC2 *b* enables resistor r in the second stage of the filter to be omitted. Referring to FIGS. 4a and 4b, it will be apparent that DAC2 *a* and DAC2 *b* do not provided complete compensation for the omitted resistors. Thus, while DAC2 *a* is fully equivalent to resistor $r_1$, DAC2 *b* is not fully equivalent to resistor $r_2$, since there will be no equivalent the effect of the voltage across $L_3C_3$ on $r_2$. This is compensated for by increasing the signal from DAC2 *a* over and above what is required for DAC2 *a* to produce the same effect in the output of buffer amplifier 10 as resistor $r_1$. This is possible since the increased effect of DAC2 *a* on $L_4C_4$ will be the same as the effect $L_3C_3$ would have had on omitted resistor $r_2$. DAC2 *b* compensates for the effect of omitted resistor $r_1$ on the omitted resistor $r_2$.

Modifications may of course be made without departing from the scope of the invention. Thus, instead of monitoring the voltage across parallel resonant circuits (without series resistive means) and presenting an output voltage to the comparator, the current through series resonant circuits (without parallel resistive means) could be monitored, and a current could be presented to the comparator. Equally, ceramic resonators could be employed as resonant circuits as an alternative to inductive capacitative filters. Finally, all the embodiments of FIGS. 4a to 6 could be baseband instead of bandpass implementations, i.e., the resonant filter circuits could be integrating filter circuits, i.e., capacitors.

I claim:

1. An analog-to-digital converter having an input for receiving analog signals, the converter comprising:
    quantizing means for producing a digital output of the converter;
    first combining means for combining the analog input with a first feedback signal derived from the digital output and producing a first combined signal; and
    filter means for filtering the first combined signal, the filter means including:
    at least two filter circuit stages each comprising a parallel resonant circuit which is not connected to a respective phase-modifying series resistive means; and
    second combining means for combining an output from the filter means after a final filter circuit stage of the filter means with a second feedback signal derived from the digital output,
    said filter means producing a signal for input to the quantizing means;
    wherein said second combining means comprises a summing node.

2. An analog-to-digital converter as claimed in claim 1 wherein the at least one filter circuit stage of the filter means is a first stage of the filter means.

3. An analog-to-digital converter having an input for receiving analog signals, the converter comprising:
    quantizing means for producing a digital output of the converter;
    first combining means for combining the analog input with a first feedback signal derived from the digital output and producing a first combined signal; and
    filter means for filtering the first combined signal, the filter means including:
    at least one filter circuit stage which is not connected to phase-modifying resistive means; and
    second combining means for combining an output from the at least one filter circuit stage with a second feedback signal derived from the digital output,
    said filter means producing a signal for input to the quantizing means;
    wherein the filter means includes two filter circuit stages each stage comprising:
    parallel resonant circuits without series resistive means, and
    a buffer circuit,
    wherein respective output signals of each stage are combined by said second combining means with respective feedback signals derived from the digital output at the outputs of the respective buffers.

4. An analog-to-digital converter having an input for receiving analog signals, the converter comprising:
    quantizing means for producing a digital output of the converter;
    first combining means for combining the analog input with a first feedback signal derived from the digital output and producing a first combined signal; and
    filter means for filtering the first combined signal, the filter means including:
    at least one filter circuit stage which is not connected to phase-modifying resistive means; and
    second combining means for combining an output from the at least one filter circuit stage with a second feedback signal derived from the digital output,
    said filter means producing a signal for input to the quantizing means;
    wherein the at least one filter circuit stage is a first filter circuit stage of the filter means, and wherein the filter means further comprises a second filter circuit stage following the first filter circuit stage, the second filter circuit stage being followed by a buffer, the output from the at least one filter circuit stage of the filter means being combined with the signal derived from the digital output by said second combining means at the output of the buffer following the second filter circuit stage.

5. An analog-to-digital converter having an input for receiving analog signals, the converter comprising:
    quantizing means for producing a digital output of the converter;
    first combining means for combining the analog input with a first feedback signal derived from the digital output and producing a first combined signal; and
    filter means for filtering the first combined signal, the filter means including:
    at least two filter circuit stages each comprising a parallel resonant circuit which is not connected to a respective phase-modifying series resistive means; and
    second combining means for combining an output from at least one of the filter circuit stages with a second feedback signal derived from the digital output,
    said filter means producing a signal for input to the quantizing means;
    wherein the quantizing means includes a comparator.

6. An analog-to-digital converter as claimed in claim 5, wherein the comparator is a.c. coupled to the filter means.

7. An analog-to-digital converter having an input for receiving analog signals, the converter comprising:
    quantizing means for producing a digital output of the converter;

first combining means for combining the analog input with a first feedback signal derived from the digital output and producing a first combined signal; and filter means for filtering the first combined signal, the filter means including:
- at least one filter circuit stage which is not connected to phase-modifying resistive means; and
- second combining means for combining an output from the at least one filter circuit stage with a second feedback signal derived from the digital output, said filter means producing a signal for input to the quantizing means;

wherein the quantizing means includes a comparator;

wherein the converter further comprises a buffer having a pair of differential inputs, and d.c. feedback means for providing a third feedback signal derived from the digital output, wherein the at least one filter circuit stage is connected to one of said buffer inputs, the d.c. feedback means being connected to another of the buffer inputs.

8. An analog-to-digital converter as claimed in claim 7, wherein the d.c. feedback means includes a digital-to-analog converter connected to an output of the quantizing means followed by an integrator connected to the buffer input.

9. An analog-to-digital converter having an input for analog signals, the converter comprising:
- quantizing means for producing a digital output of the converter;
- first combining means for combining the analog input with a feedback signal derived from the digital output with the analog input and producing a first combined signal; and
- filter means for filtering the first combined signal, the filter means including:
  - at least one filter circuit stage which is not connected to phase modifying resistive means,
  - at least one buffer, having a pair of differential inputs, and
  - resistive means,
- wherein the at least one filter circuit is connected between ground and one input of the pair of differential inputs, and the resistive means is connected to another input of the pair of differential inputs.

10. An analog-to-digital converter as claimed in claim 9, wherein the at least one filter circuit stage of the filter means is followed by the buffer having a pair of differential inputs.

11. An analog-to-digital converter as claimed in claim 9, wherein the quantizing means includes a comparator.

12. An analog-to-digital converter as claimed in claim 11, wherein the comparator is a.c. coupled to the filter means.

13. An analog-to-digital converter as claimed in claim 11, wherein the resistive means comprises d.c. feedback means for providing a second feedback signal derived from the output of the converter.

14. An analog-to-digital converter as claimed in claim 13, wherein the d.c. feedback means includes a digital-to-analog converter connected to an output of the quantizing means followed by an integrator connected to said other differential input of the buffer.

* * * * *